(12) United States Patent
Wang et al.

(10) Patent No.: US 12,317,510 B2
(45) Date of Patent: May 27, 2025

(54) MEMORY ARRAY

(71) Applicant: UNITED MICROELECTRONICS CORP., Hsin-Chu (TW)

(72) Inventors: Hui-Lin Wang, Taipei (TW); Ju-Chun Fan, Tainan (TW); Ching-Hua Hsu, Kaohsiung (TW); Chun-Hao Wang, Taipei (TW); Yi-Yu Lin, Taichung (TW); Dong-Ming Wu, Taichung (TW); Po-Kai Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 665 days.

(21) Appl. No.: 17/673,760

(22) Filed: Feb. 16, 2022

(65) Prior Publication Data

US 2023/0232638 A1  Jul. 20, 2023

(30) Foreign Application Priority Data

Jan. 14, 2022 (CN) .......................... 202210041541.3

(51) Int. Cl.
| | |
|---|---|
| *H10B 61/00* | (2023.01) |
| *G11C 5/02* | (2006.01) |
| *H01L 23/522* | (2006.01) |
| *H01L 23/528* | (2006.01) |
| *H10N 50/10* | (2023.01) |
| *H10N 50/80* | (2023.01) |

(52) U.S. Cl.
CPC ............... *H10B 61/20* (2023.02); *G11C 5/02* (2013.01); *H01L 23/5226* (2013.01); *H01L 23/5283* (2013.01); *H10N 50/10* (2023.02); *H10N 50/80* (2023.02)

(58) Field of Classification Search
CPC ........ H10B 61/20; H10N 50/80; H10N 50/10; G11C 5/02; H01L 23/5226; H01L 23/5283
USPC ......................................................... 257/421
See application file for complete search history.

(56) References Cited

U.S. PATENT DOCUMENTS

2022/0271088 A1* 8/2022 Hsu .................... H10N 50/80

OTHER PUBLICATIONS

Wang, the specification, including the claims, and drawings in the U.S. Appl. No. 17/090,859, filed Nov. 5, 2020.
Hsu, the specification, including the claims, and drawings in the U.S. Appl. No. 17/202,296, filed Mar. 15, 2021.

* cited by examiner

*Primary Examiner* — Tu-Tu V Ho
(74) *Attorney, Agent, or Firm* — Winston Hsu

(57) ABSTRACT

A memory array includes at least one strap region, at least two sub-arrays, a plurality of staggered, dummy magnetic storage elements, and a plurality of bit line structures. The strap region includes a plurality of source line straps and a plurality of word line straps. The two sub-arrays include a plurality of staggered, active magnetic storage elements. The two sub-arrays are separated by the strap region. The staggered, dummy magnetic storage elements are disposed within the strap region. The bit line structures are disposed in the two sub-arrays, and each of the bit line structures is disposed above and directly connected with at least one of the staggered, active magnetic storage elements.

19 Claims, 13 Drawing Sheets

MEMORY ARRAY

BACKGROUND OF THE INVENTION

1. Field of the Invention

The present invention relates to a semiconductor device, in particular to a high-density magnetoresistive random access memory (MRAM) array.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in the related field.

SUMMARY OF THE INVENTION

It is one object of the present invention to provide a high-density magnetoresistive random access memory (MRAM) array to solve the above-mentioned shortcomings or deficiencies of the prior art.

According to one aspect of the present invention, a memory array includes at least one strap region including a plurality of source line straps and a plurality of word line straps; at least two sub-arrays including a plurality of staggered, active magnetic storage elements, wherein the at least two sub-arrays are separated by the strap region; a plurality of staggered, dummy magnetic storage elements disposed within the strap region; and a plurality of bit line structures disposed in the at least two sub-arrays, wherein each of the plurality of bit line structures is disposed above and directly connected with at least one of the plurality of staggered, active magnetic storage elements.

According to some embodiments of the present invention, each of the plurality of bit line structures is directly connected with at least two of the plurality of staggered, active magnetic storage elements aligned in the same row.

According to some embodiments of the present invention, each of the plurality of bit line structures includes a first bit line and a second bit line disposed above the first bit line, and the first bit line and the second bit line are elongated in the same direction and electrically connected with each other.

According to some embodiments of the present invention, each of the plurality of bit line structures further includes at least one conductive via disposed between the first bit line and the second bit line, wherein the first bit line is electrically connected with the second bit line through the at least one conductive via.

According to some embodiments of the present invention, a top electrode of at least one of the plurality of staggered, dummy magnetic storage elements is electrically connected with one of the plurality of word line straps through a pad disposed on the at least one of the plurality of staggered, dummy magnetic storage elements.

According to some embodiments of the present invention, the pad is a portion of a metal layer, each of the first bit lines is another portion of the metal layer, and the pad is separated from the first bit lines.

According to some embodiments of the present invention, the plurality of source line straps includes a plurality of first source line straps extending in a first direction and a plurality of second source line straps extending in the first direction.

According to some embodiments of the present invention, the plurality of word line straps extends in the first direction and is located between the plurality of first source line straps and the plurality of second source line straps in a second direction According to some embodiments of the present invention, the first direction is orthogonal to the second direction.

According to some embodiments of the present invention, each of the plurality of first source line straps is connected to a common source line extending in the second direction.

According to some embodiments of the present invention, the memory array further includes a first dummy diffusion region extending in the first direction, and the first dummy diffusion region is disposed directly under the plurality of first source line straps.

According to some embodiments of the present invention, the memory array further includes a second dummy diffusion region extending in the first direction, and the second dummy diffusion region is disposed directly under the plurality of second source line straps.

According to some embodiments of the present invention, the memory array further includes a third dummy diffusion region extending in the first direction, the third dummy diffusion region is disposed directly under the plurality of word line straps, and the third dummy diffusion region is located between the first dummy diffusion region and the second dummy diffusion region in the second direction.

According to some embodiments of the present invention, the memory array further includes a plurality of gate lines extending in the second direction.

According to some embodiments of the present invention, the plurality of staggered, active magnetic storage elements includes a plurality of first active magnetic storage elements arranged in a first column and a plurality of second active magnetic storage elements arranged in a second column, wherein the plurality of first active magnetic storage elements arranged in the first column and the plurality of second active magnetic storage elements arranged in the second column are aligned with the plurality of gate lines extending in the second direction, respectively.

According to some embodiments of the present invention, each of the plurality of staggered, active magnetic storage elements is electrically connected to a storage node pad through a tungsten via.

According to some embodiments of the present invention, no tungsten via is disposed within the strap region.

According to some embodiments of the present invention, the plurality of staggered, dummy magnetic storage elements includes dummy magnetic tunneling junction (MTJ) elements.

According to some embodiments of the present invention, bottom electrodes of the dummy MTJ elements are not electrically connected to the plurality of source line straps or the plurality of word line straps.

According to some embodiments of the present invention, the plurality of staggered, active magnetic storage elements and the plurality of staggered, dummy magnetic storage elements are uniformly distributed in the at least two sub-arrays and the strap region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The present invention pertains to a high-density memory layout, in particular a high-density magnetoresistive random access memory (MRAM) array. The special technical features includes: a plurality of staggered dummy magnetic storage elements may be arranged in a strap region between two sub-arrays, so that the active magnetic storage elements and the dummy magnetic storage elements of the memory array are evenly distributed in the two sub-arrays and the strap region in a staggered arrangement. Therefore, a high-density memory layout can be realized. In addition, the influence of the conductive via directly contacting the active magnetic storage element on the alignment deviation may be avoided by disposing the bit line structure in the sub-array, wherein the bit line structure is disposed above and directly contacts the active magnetic storage element. The related manufacturing yield may be enhanced accordingly.

In the following detailed description, metal layers Mn represent the different metal layers in the metal interconnect structure, where n is a positive integer. For example, the metal layer M1 represents the first metal layer in the metal interconnect structure, and the metal layer M2 represents the second metal layer in the metal interconnect structure, and so on. The conductive vias Vn represent the different conductive vias in the metal interconnection structure. For example, the conductive via V1 represents the conductive via connecting the metal layer M1 to the metal layer M2, and the conductive via V2 represents the conductive via connecting the metal layer M2 to the metal layer M3, and so on. Different objects formed of the same metal layer (and/or the metal layer at the same level) may be regarded as being located in the same metal layer, and the different objects located in the same metal layer may be separated from one another or connected with one another according to some design considerations.

Figure 1:
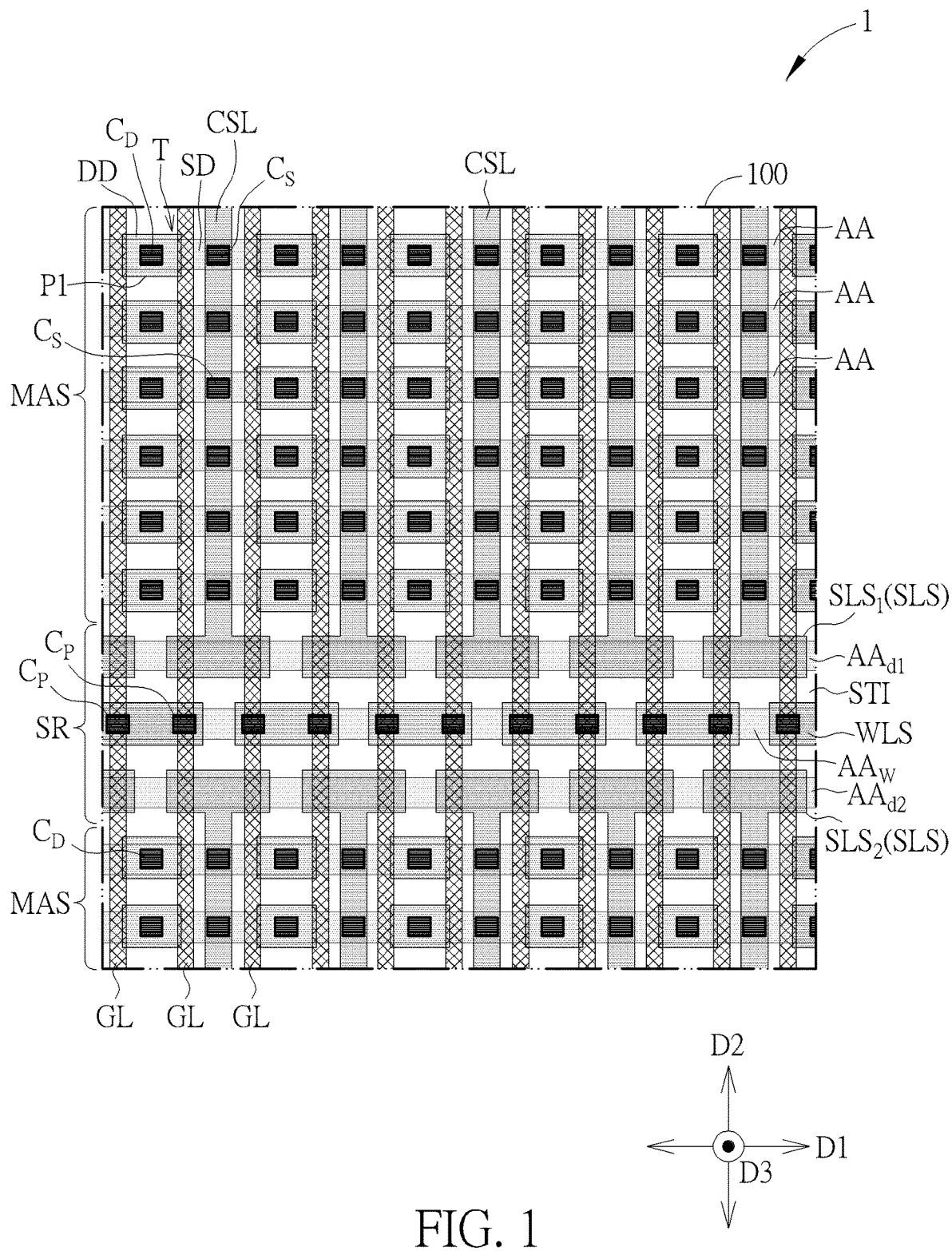
FIG. 1 is a schematic diagram of a memory array according to an embodiment of the present invention, which mainly shows active areas, polysilicon gate lines, and common source lines, source line straps and word line straps located in the first metal layer.

Please refer to FIG. 1, which is a schematic diagram of a memory array according to an embodiment of the present invention, which mainly shows active areas, polysilicon gate lines, and common source lines, source line straps, and word line straps located in the first metal layer (such as the metal layer M1). As shown in FIG. 1, the memory array 1 includes at least two sub-arrays MAS and at least one strap region SR. According to an embodiment of the present invention, the strap region SR is a strip-shaped region extending in a first direction D1, and the two sub-arrays MAS are separated by the strap region SR. According to an embodiment of the present invention, the memory array 1 further includes a plurality of gate lines (such as polysilicon gate lines GL)

extending in a second direction D2 and a plurality of active areas AA extending in the first direction D1 formed in a semiconductor substrate 100. According to an embodiment of the present invention, the first direction D1 is orthogonal to the second direction D2. According to an embodiment of the present invention, the active areas AA are isolated from one another by the shallow trench isolation areas STI.

According to an embodiment of the present invention, the polysilicon gate lines GL pass through the two sub-arrays MAS and the strap region SR, and form transistors T at the intersections between the polysilicon gate lines GL and the active areas AA in the sub-array MAS. According to an embodiment of the present invention, the transistor T includes a source region SD and a drain region DD, for example, an $N^+$ doped region, but not limited thereto. According to an embodiment of the present invention, a first dummy diffusion region $AA_{d1}$ and a second dummy diffusion region $AA_{d2}$ extending in the first direction D1, which are respectively adjacent to the two sub-arrays MAS, and a third dummy diffusion region $AA_W$ located between first dummy diffusion region $AA_{d1}$ and the second dummy diffusion region $AA_{d2}$ in the second direction D2 are further provided in the strap region SR. According to an embodiment of the present invention, the first dummy diffusion region $AA_{d1}$, the second dummy diffusion region $AA_{d2}$, the third dummy diffusion region $AA_W$, and the active areas AA are semiconductor regions located in the semiconductor substrate 100 and defined by the shallow trench isolation areas STI. According to an embodiment of the present invention, the first dummy diffusion region $AA_{d1}$, the second dummy diffusion region $AA_{d2}$, and the third dummy diffusion region $AA_W$ may help improve the manufacturing yield of memory cells located at the edge of the sub-arrays MAS.

According to an embodiment of the present invention, a plurality of source line straps SLS and a plurality of word line straps WLS located in the first metal layer are further provided in the strap region SR. The plurality of source line straps SLS includes a plurality of first source line straps $SLS_1$ extending in the first direction D1 and a plurality of second source line straps $SLS_2$ extending in the first direction D1. According to an embodiment of the present invention, the plurality of first source line straps $SLS_1$ are substantially aligned with the first dummy diffusion region $AA_{d1}$, the plurality of second source line straps $SLS_2$ are substantially aligned with the second dummy diffusion region $AA_{d2}$, and the plurality of word line straps WLS are substantially aligned with the third dummy diffusion region $AA_W$. In other words, the first dummy diffusion region $AA_{d1}$ may be disposed directly under the plurality of first source line straps $SLS_1$ in a third direction D3, the second dummy diffusion region $AA_{d2}$ may be disposed directly under the plurality of second source line straps $SLS_2$ in the third direction D3, and the third dummy diffusion region $AA_W$ may be disposed directly under the plurality of word line straps WLS in the third direction D3. According to an embodiment of the present invention, the third direction D3 may be regarded as a vertical direction and may be orthogonal to the first direction D1 and the second direction D2. According to an embodiment of the present invention, the width of the first dummy diffusion region $AA_{d1}$, the width of the second dummy diffusion region $AA_{d2}$, the width of the third dummy diffusion region $AA_W$ may, and the spacing between the first dummy diffusion region $AA_{d1}$, the second dummy diffusion region $AA_{d2}$, and third dummy diffusion region $AA_W$ in the second direction D2 may be substantially equal to the width of each active area AA and the spacing between the active areas AA in the second direction, so as to improve related manufacturing uniformity and/or enhance relative manufacturing yield.

According to an embodiment of the present invention, a plurality of word line straps WLS, which is also located in the first metal layer, may be provided in the strap region SR. According to an embodiment of the present invention, in the second direction D2, the plurality of first source line straps $SLS_1$ extending in the first direction D1 and the plurality of second source line straps $SLS_2$ extending in the first direction D1 sandwich about the plurality of word lines straps WLS extend in the first direction D1. Therefore, the plurality of word lines straps WLS is located between the plurality of first source line straps $SLS_1$ and the plurality of second source line straps $SLS_2$ in the second direction D2. According to an embodiment of the present invention, the word line strap WLS, the first source line strap $SLS_1$ and the second source line strap $SLS_2$ are arranged in a staggered manner. According to an embodiment of the present invention, each word line strap WLS is electrically connected to two adjacent polysilicon gate lines GL through two contact plugs $C_P$.

According to an embodiment of the present invention, the first source line straps $SLS_1$ are respectively connected to the common source line CSL extending in the second direction D2. According to an embodiment of the present invention, the common source line CSL is electrically connected to the source regions SD of the transistors T through the source contact plugs $C_S$, respectively. According to an embodiment of the present invention, the memory array 1 further includes a plurality of pads P1 located on the drain regions DD of the transistors T and electrically connected to the drain regions DD of the transistors T through the drain contact plugs $C_D$, respectively. According to an embodiment of the present invention, the pads P1 and the common source lines CSL may also be located in the first metal layer. In other words, the word line straps WLS, the source line straps SLS, the pads P1, and the common source lines CSL may be different portions of the first metal layer (such as the metal layer M1).

Figure 2:
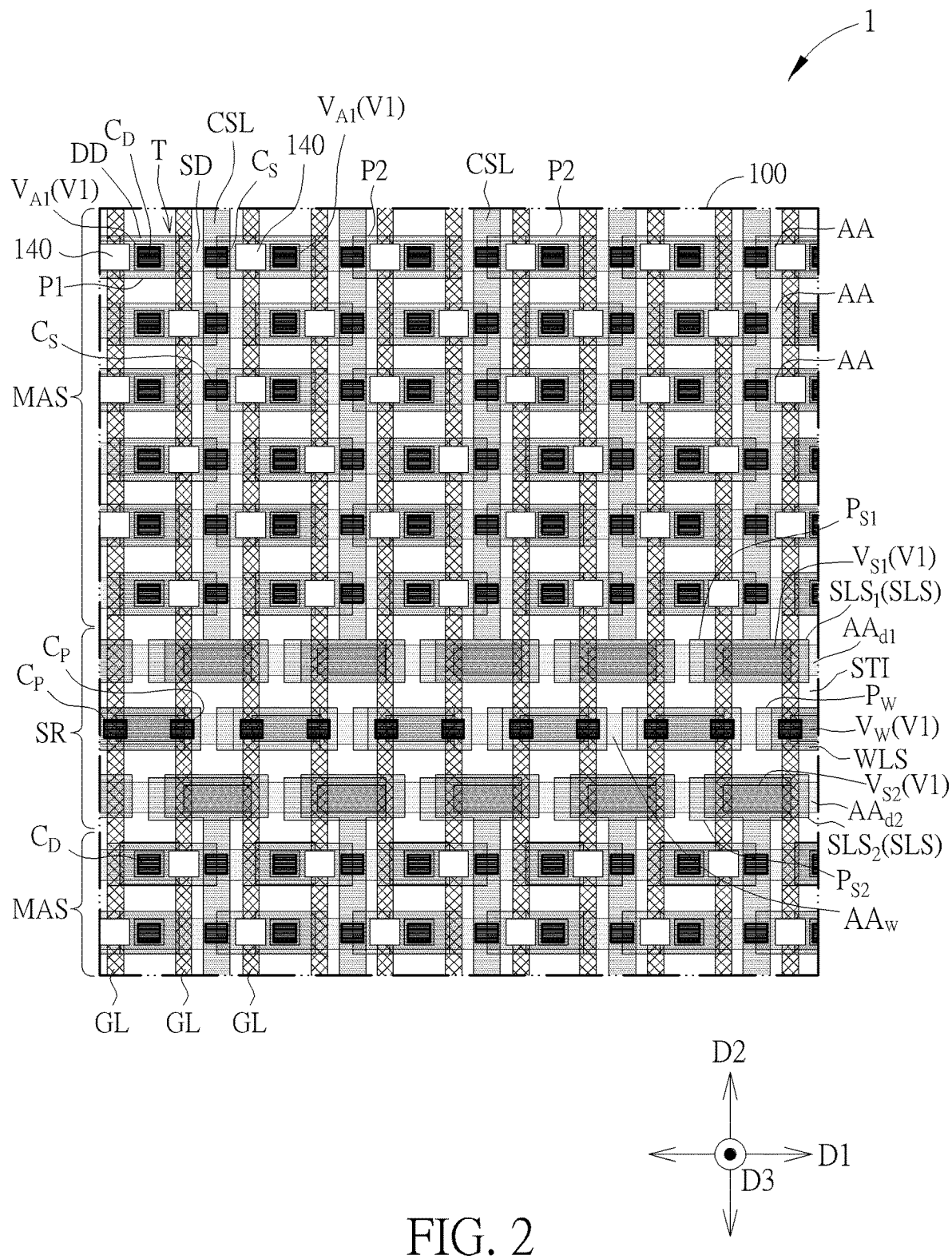
FIG. 2 is a schematic diagram of a memory array according to an embodiment of the present invention, which mainly shows the positions of conductive vias, storage node pads, and tungsten vias.

Please refer to FIG. 2, which is a schematic diagram of a memory array according to an embodiment of the present invention, which mainly shows the positions of conductive vias, storage node pads, and tungsten vias. As shown in FIG. 2, the memory array 1 further includes a plurality of conductive vias V1, and the conductive vias V1 may include a conductive via $V_{A1}$ provided on each of the pads P1 in the sub-arrays MAS, a conductive via $V_{S1}$ on each of the first source line straps $SLS_1$, a conductive via $V_{S2}$ on each of the second source line straps $SLS_2$, and a conductive via $V_W$ on each of the word line straps WLS in the strap region SR. According to an embodiment of the present invention, a width (or a length) of the conductive via $V_{S1}$, a width (or a length) of the conductive via $V_{S2}$, and a width (or a length) of the conductive via $V_W$ in the first direction D1 may be greater than a width (or a length) of the conductive via $V_{A1}$ in the first direction D1.

According to an embodiment of the present invention, the memory array 1 further includes a plurality of storage node pads P2 in the sub-arrays MAS, which are electrically connected to the conductive vias $V_{A1}$, respectively, and located in the second metal layer (such as the metal layer M2), pads $P_{S1}$ electrically connected to the conductive vias $V_{S1}$ in the strap region SR, pads $P_{S2}$ electrically connected to the conductive vias $V_{S2}$ in the strap region SR, and pads $P_W$ electrically connected to the conductive vias $V_W$ in the strap region SR. According to an embodiment of the present invention, each of the storage node pads P2 may have a rectangular outline, the long side of which is parallel to the first direction D1. Each of the storage node pads P2 may partially overlap the underlying polysilicon gate lines GL. According to an embodiment of the present invention, the storage node pad P2, the pad $P_{S1}$, the pad $P_{S2}$, and the pad $P_W$ may be both located in the second metal layer. In other words, the storage node pad P2, the pad $P_{S1}$, the pad $P_{S2}$, and the pad $P_W$ may be different portions of the second metal layer (such as the metal layer M2). According to an embodiment of the present invention, the memory array 1 further includes a plurality of tungsten vias 140 in the sub-arrays MAS, which are respectively electrically connected to the corresponding storage node pads P2. According to an embodiment of the present invention, the plurality of tungsten vias 140 may be arranged in a staggered arrangement and may be substantially aligned with the polysilicon gate lines GL below. According to an embodiment of the present invention, no tungsten vias are arranged on the pads $P_{S1}$, the pads $P_{S2}$, and the pads $P_W$ in the strap region SR.

Figure 3:
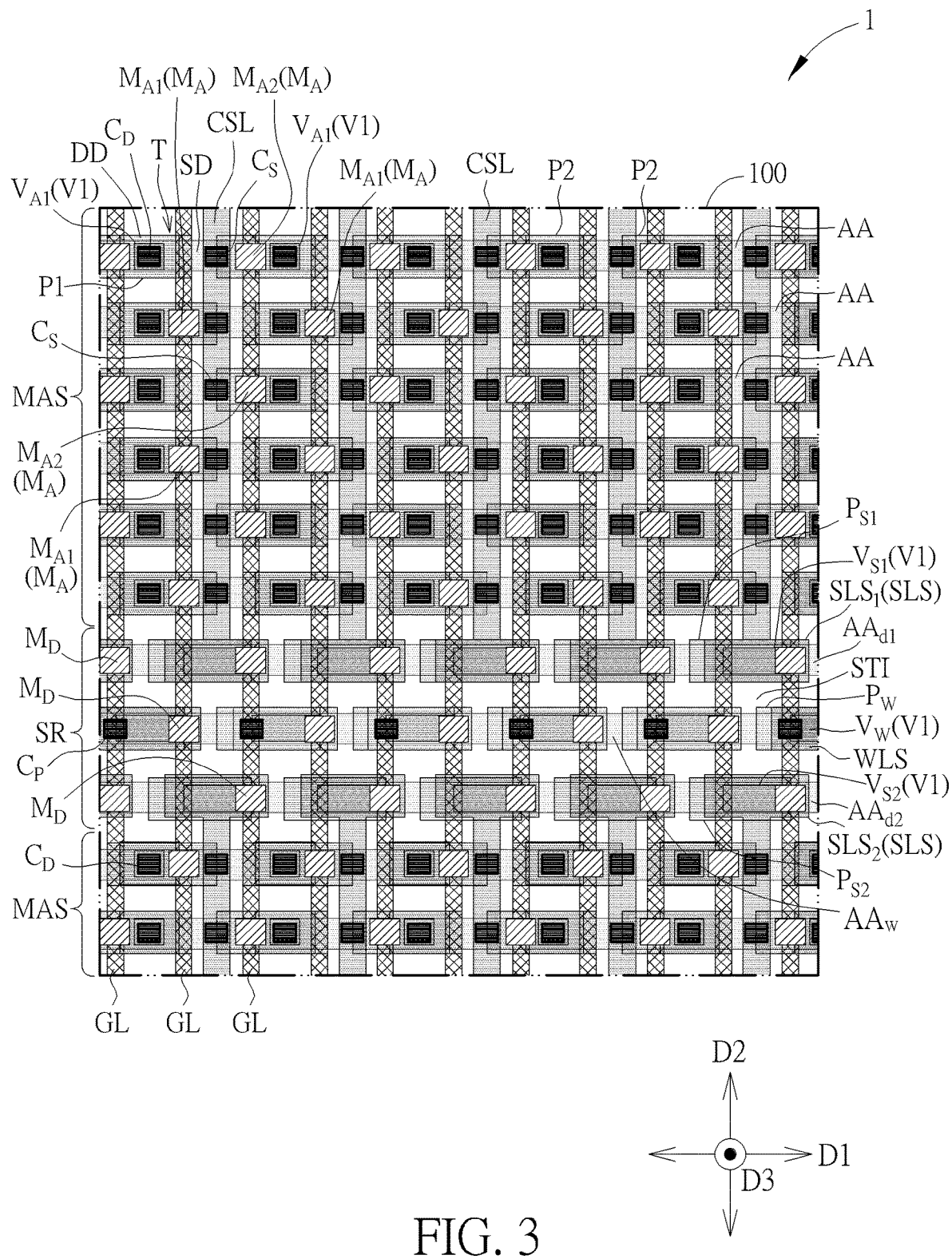
FIG. 3 is a schematic diagram of a memory array according to an embodiment of the present invention, which mainly shows the positions of magnetic storage elements.

Please refer to FIG. 2 and FIG. 3, which is a schematic diagram of a memory array according to an embodiment of the present invention, which mainly shows the position of the magnetic storage elements. As shown in FIG. 2 and FIG. 3, the sub-array MAS of the memory array 1 includes a plurality of staggered active magnetic storage elements $M_A$, and the strap region SR includes a plurality of staggered dummy magnetic storage elements $M_D$. According to an embodiment of the present invention, in the sub-arrays MAS, the active magnetic storage elements $M_A$ are disposed on the corresponding tungsten vias 140, that is, the active magnetic storage elements $M_A$ are substantially aligned with the corresponding tungsten vias 140, respectively, and are approximately aligned with the underlying polysilicon gate lines GL, respectively. The active magnetic storage elements $M_A$ are electrically connected to the storage node pads P2, respectively, through the tungsten vias 140.

According to an embodiment of the present invention, the active magnetic storage elements $M_A$ include a plurality of first active magnetic storage elements $M_{A1}$ arranged in a first column and a plurality of second active magnetic storage elements $M_{A2}$ arranged in a second column. The first active magnetic storage elements $M_{A1}$ arranged in the first column and the second active magnetic storage elements $M_{A2}$ arranged in the second column are respectively aligned with corresponding polysilicon gate lines GL extending in the second direction D2.

According to an embodiment of the present invention, each of the active magnetic storage elements $M_A$ and the dummy magnetic storage elements $M_D$ may include a magnetic tunnel junction (MTJ) element. According to an embodiment of the present invention, the MTJ element may include a multilayer structure, for example, a bottom electrode, a top electrode, and a magnetic tunnel junction structure between the bottom electrode and the top electrode. The magnetic tunnel junction structure may include, but not limited to, a reference layer, a channel layer, a free layer and a cap layer. According to an embodiment of the present invention, the bottom electrode of the MTJ element (dummy MTJ element) of the dummy magnetic storage element $M_D$ is not electrically connected to the source line strap or the word line strap.

According to an embodiment of the present invention, the dummy magnetic storage elements $M_D$ are respectively arranged on the pads $P_{S1}$, the pads $P_{S2}$ and the pads $P_W$ in the strap region SR in a staggered manner. Since there are no tungsten vias arranged on the pads $P_{S1}$, the pads $P_{S2}$, and the pads $P_W$ in the strap region SR, the bottom electrode of the dummy magnetic storage element $M_D$ will not be directly electrically connected to the pads $P_{S1}$, the pads $P_{S2}$, and the pads $P_W$ in the strap region SR. According to an embodiment of the present invention, there are only dielectric layers between the dummy magnetic storage element $M_D$ and the pad $P_{S1}$, between the dummy magnetic storage element $M_D$ and the pad $P_{S2}$, and between the dummy magnetic storage element $M_D$ and the pad $P_W$.

According to an embodiment of the present invention, the staggered active magnetic storage elements $M_A$ and the staggered dummy magnetic storage elements $M_D$ are evenly distributed on the two sub-arrays MAS and the strap region SR. Such a uniform and repeated arrangement of magnetic storage elements can specifically realize a high-density memory layout.

Figure 4:
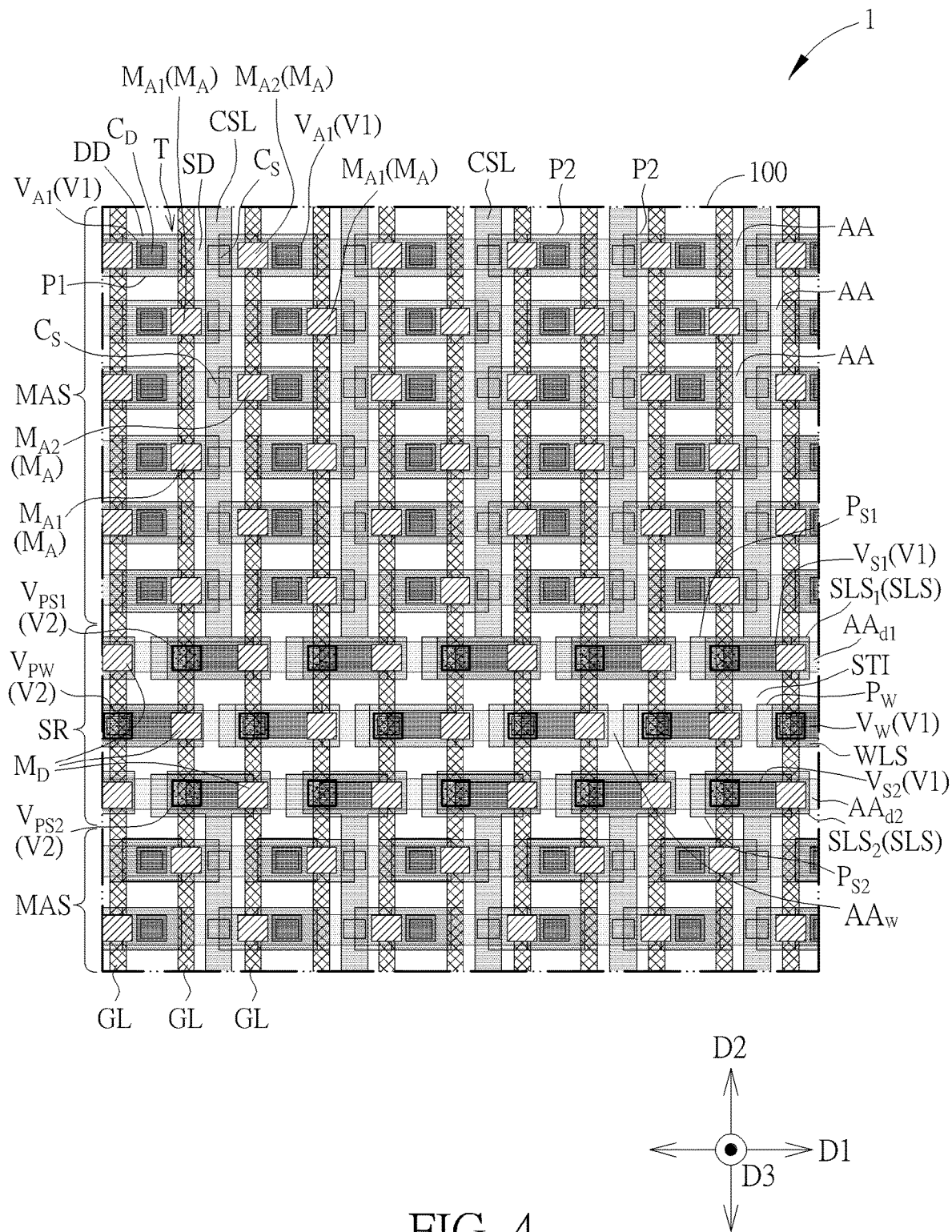
FIG. 4 is a schematic diagram of a memory array according to an embodiment of the present invention, which mainly shows the position of conductive via in the strap region.

Please refer to FIG. 4, which is a schematic diagram of a memory array according to an embodiment of the present invention, which mainly shows the position of the conductive via (such as the conductive vias V2) in the strap region SR. As shown in FIG. 4, the memory array 1 is additionally provided with staggered conductive vias $V_{PS1}$, conductive vias $V_{PW}$, and conductive vias $V_{PS2}$ in the strap region SR. The conductive vias $V_{PS1}$, conductive vias $V_{PW}$, and conductive vias $V_{PS2}$ are electrically connected to the pads $P_{S1}$, the pads $P_W$, and the pads $P_{S2}$ located underneath, respectively.

Figure 5:
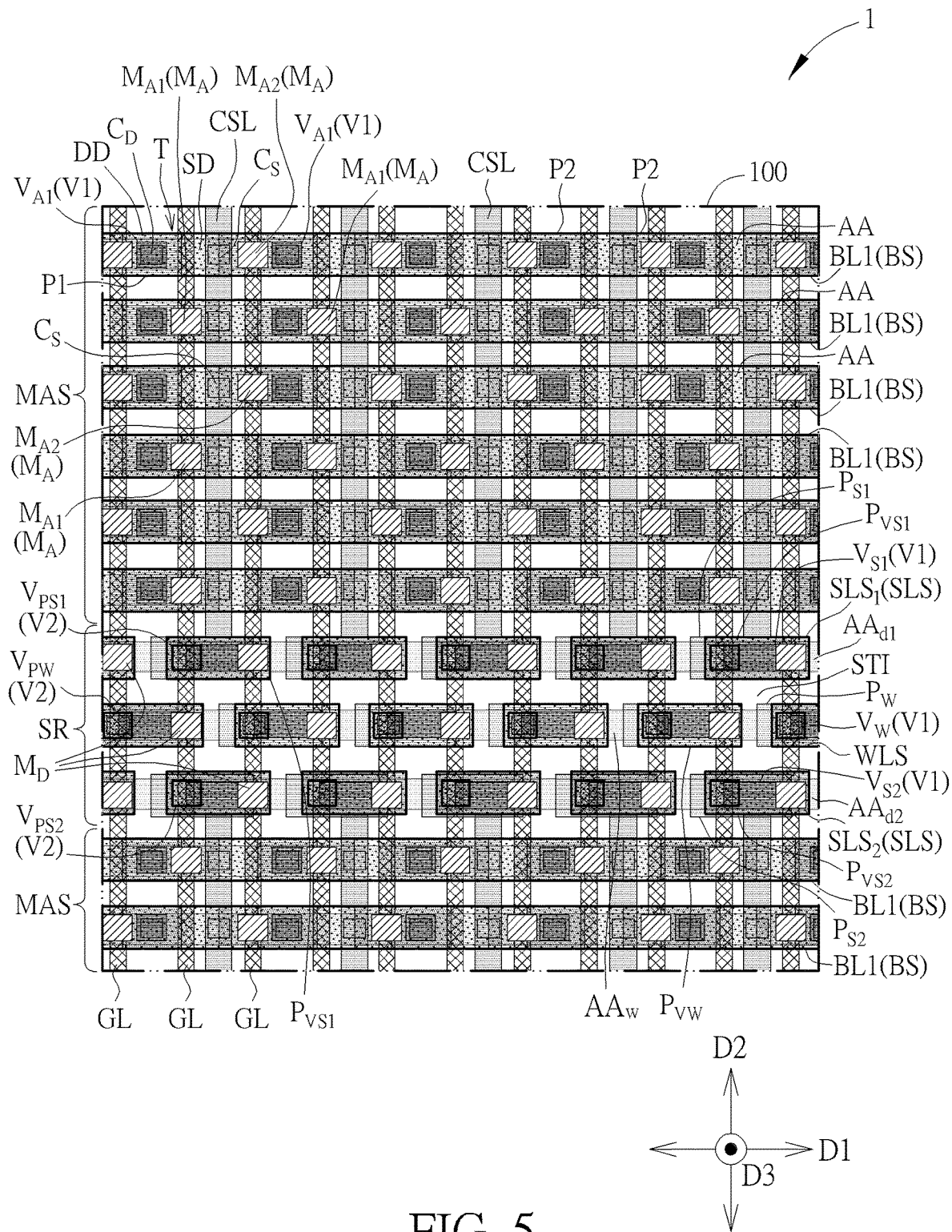
FIG. 5 is a schematic diagram of a memory array according to an embodiment of the present invention, which mainly shows the positions of the first bit lines and the pads located in the third metal layer in the strap region.

Please refer to FIG. 5, which is a schematic diagram of a memory array according to an embodiment of the present invention, which mainly shows the positions of the pads located on the third metal layer (such as the metal layer M3) in the strap region SR and the first bit lines. As shown in FIG. 5, the memory array 1 is additionally provided with pads $P_{VS1}$, pads $P_{VW}$, and pads $P_{VS2}$ located in the third metal layer in the strap region SR. The dimensions and the positions of the pads $P_{VS1}$, the pads $P_{VW}$, and the pads $P_{VS2}$ may be substantially the same as the underlying first source line strap $SLS_1$, the word line strap WLS, and the second source line strap $SLS_2$.

As shown in FIG. 5, the memory array 1 further includes a plurality of first bit lines BL1 disposed in the two sub-arrays MAS, and each of the first bit lines BL1 may be disposed above and directly connected with the corresponding active magnetic storage element $M_A$. According to an embodiment of the present invention, each of the first bit lines BL1 may extend in the first direction D1 and be a portion of a bit line structure BS. Therefore, the memory array 1 may include a plurality of bit line structures BS disposed above and directly connected with the corresponding active magnetic storage elements $M_A$. For example, each of the first bit lines BL1 may extend in the first direction D1 and may be disposed above and directly connected with the active magnetic storage elements $M_A$ arranged in the same row. Therefore, each of the bit line structures BS may be directly connected with the active magnetic storage elements $M_A$ arranged in the same row.

According to an embodiment of the present invention, the pad $P_{VS1}$ covers the conductive via $V_{PS1}$ and the adjacent dummy magnetic storage element $M_D$, and electrically connects the top electrode of the dummy magnetic storage element $M_D$ to the conductive via $V_{PS1}$. According to an embodiment of the present invention, the pad $P_{VS2}$ covers the conductive via $V_{PS2}$ and the adjacent dummy magnetic storage element $M_D$, and electrically connects the top electrode of the dummy magnetic storage element $M_D$ to the conductive via $V_{PS2}$. According to an embodiment of the present invention, the pad $P_{VW}$ covers the conductive via $V_{PW}$ and the adjacent dummy magnetic storage element $M_D$, and electrically connects the top electrode of the dummy magnetic storage element $M_D$ to the conductive via $V_{PW}$. In other words, a part of the pad $P_{VS1}$ may be disposed on the dummy magnetic storage element $M_D$ located on the first source line strap $SLS_1$, a part of the pad $P_{VS2}$ may be disposed on the dummy magnetic storage element $M_D$ located on the second source line strap $SLS_2$, and a part of the pad $P_{VW}$ may be disposed on the dummy magnetic storage element $M_D$ located on the word line strap WLS.

According to an embodiment of the present invention, the top electrode of the dummy magnetic storage element $M_D$ disposed on the first source line strap $SLS_1$ may be electrically connected to the corresponding first source line strap $SLS_1$ through the pad $P_{VS1}$, the conductive via $V_{PS1}$, the pad $P_{S1}$, and the conductive via $V_{S1}$. The top electrode of the dummy magnetic storage element $M_D$ disposed on the second source line strap $SLS_2$ may be electrically connected to the corresponding second source line strap $SLS_2$ through the pad $P_{VS2}$, the conductive via $V_{PS2}$, the pad $P_{S2}$, and the conductive via $V_{S2}$. The top electrode of the dummy magnetic storage element $M_D$ disposed on the word line strap WLS may be electrically connected to the corresponding word line strap WLS through the pad $P_{VW}$, the conductive via $V_{PW}$, the pad $P_W$, and the conductive via $V_W$. According to an embodiment of the present invention, the first bit line BL1, the pad $P_{VS1}$, the pad $P_{VS2}$, and the pad $P_{VW}$ may be different portions of the third metal layer, and the first bit line BL1, the pad $P_{VS1}$, the pad $P_{VS2}$, and the pad $P_{VW}$ may be separated from one another.

Figure 6:
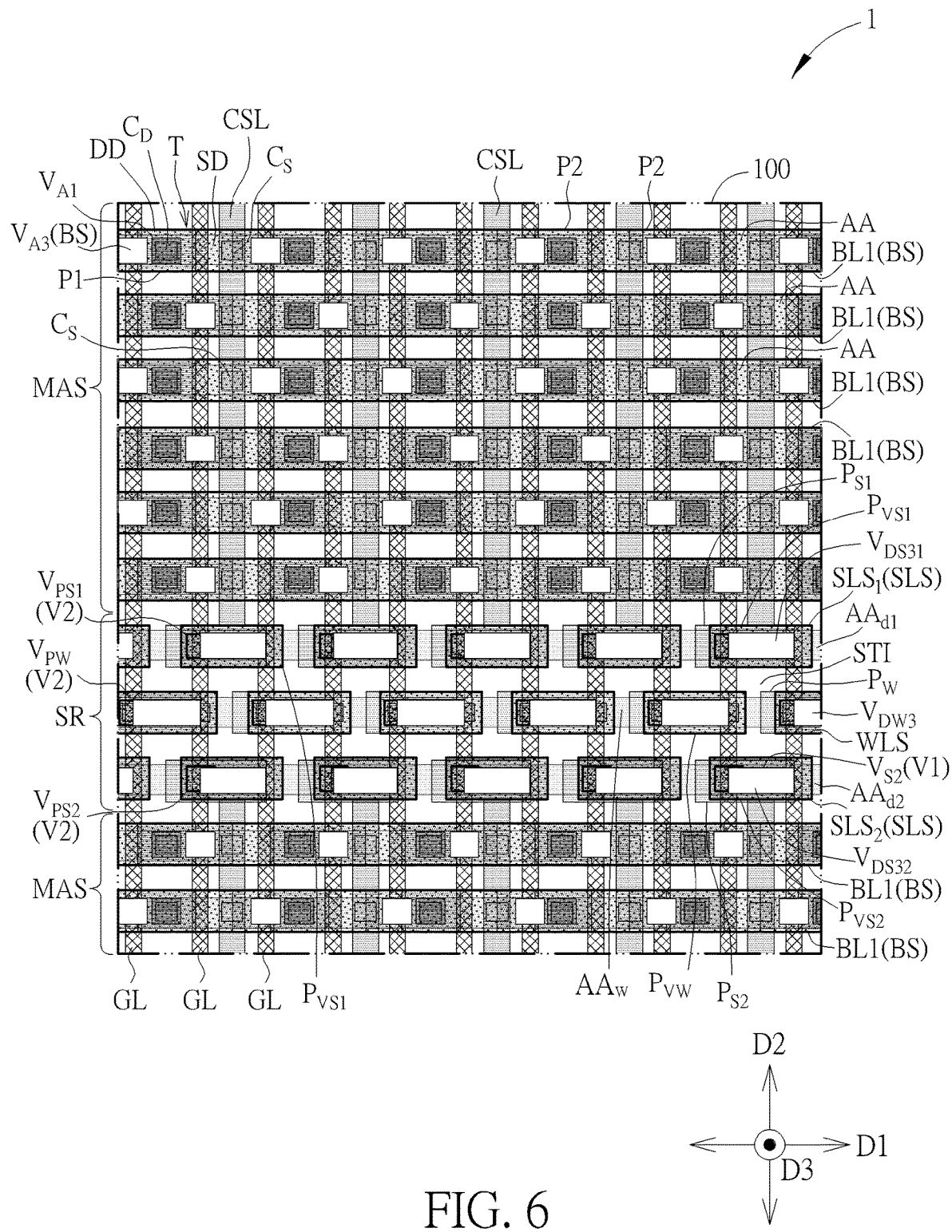
FIG. 6 is a schematic diagram of a memory array according to an embodiment of the present invention, which mainly shows the layout of the conductive vias located on the third metal layer.

Please refer to FIG. 6, which is a schematic diagram of a memory array according to an embodiment of the present invention, which mainly shows the layout of the conductive vias (such as the conductive vias V3) located above the third metal layer. As shown in FIG. 6, the memory array 1 further includes a plurality of staggered conductive vias $V_{A3}$ in the sub-arrays MAS. The conductive via $V_{A3}$ is disposed above and electrically connected with the corresponding first bit line BL1, and the conductive via $V_{A3}$ may be electrically connected to the top electrode of the active magnetic storage element $M_A$ through the corresponding first bit line BL1. According to an embodiment of the present invention, each of the conductive vias $V_{A3}$ may be a portion of the bit line structure BS and connected with the first bit line BL1 disposed in the same bit line structure BS. In some embodiments, the conductive via $V_{A3}$ may be approximately aligned with the corresponding active magnetic storage element $M_A$ in the third direction D3, but not limited thereto. The alignment accuracy requirement in the process of forming the conductive vias $V_{A3}$ may be relaxed by disposing the first bit lines BL1, and related manufacturing yield may be improved accordingly. According to an embodiment of the present invention, a plurality of conductive vias $V_{DS31}$, conductive vias $V_{DW3}$, and conductive vias $V_{DS32}$ are arranged in a staggered arrangement in the strap region SR, which are electrically connected to the pad $P_{VS1}$, the pad $P_{VW}$, and the pad $P_{VS2}$, respectively. According to an embodiment of the present invention, the conductive vias $V_{DS31}$, the conductive vias $V_{DW3}$, and the conductive vias $V_{DS32}$ have a rectangular outline, the long side of which is parallel to the first direction D1, and an area of each of the conductive vias $V_{DS31}$, an area of each of the conductive vias $V_{DW3}$, and an area of each of the conductive vias $V_{DS32}$ are larger than that of each conductive via $V_{A3}$, respectively.

Figure 7:
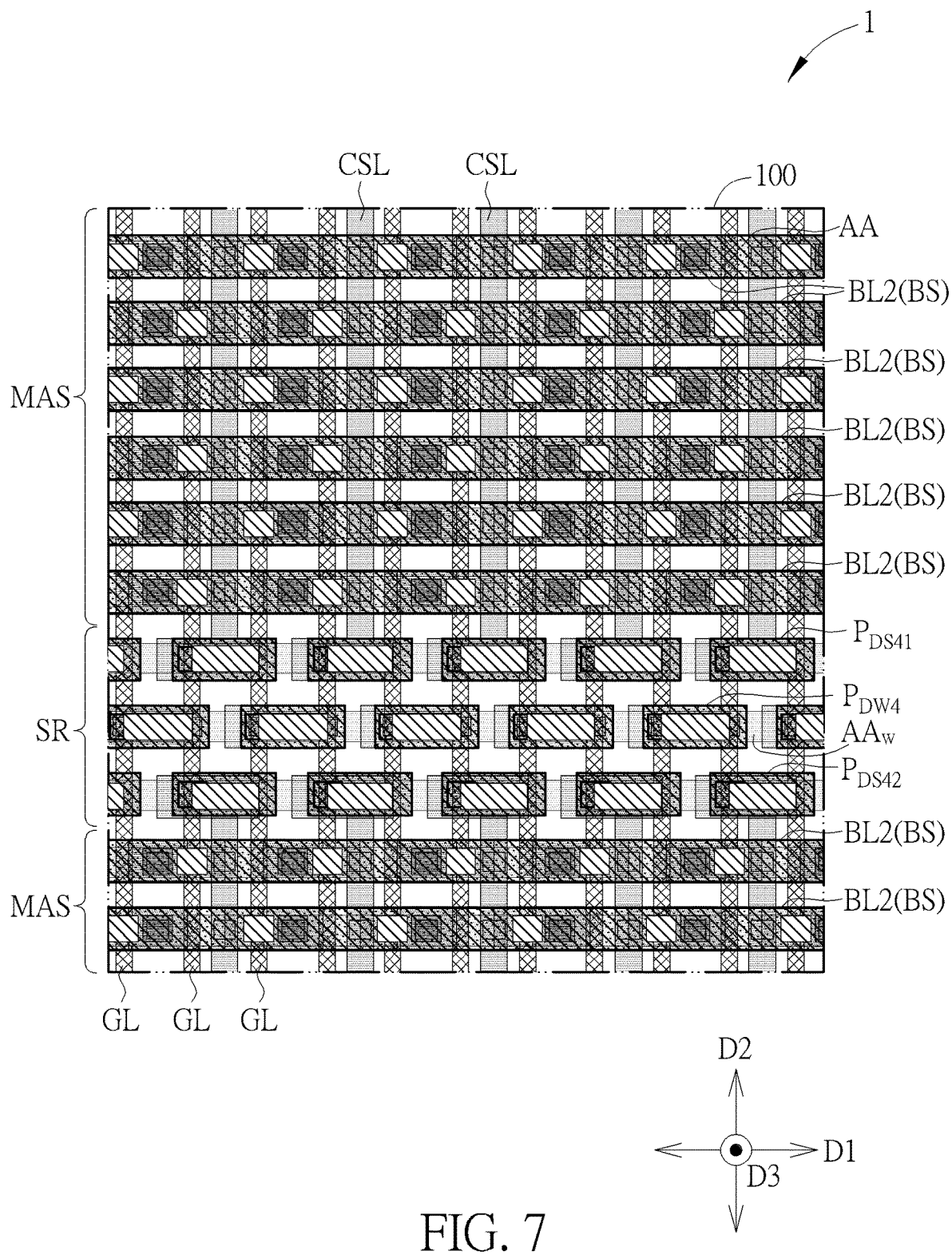
FIG. 7 is a schematic diagram of a memory array according to an embodiment of the present invention, which mainly shows the layout of the fourth metal layer.

Please refer to FIG. 6 and FIG. 7. FIG. 7 is a schematic diagram of a memory array according to an embodiment of the present invention, which mainly shows the layout of the fourth metal layer (such as the metal layer M4). As shown in FIG. 7, the memory array 1 further includes a plurality of second bit lines BL2 located in the fourth metal layer in the sub-arrays MAS. Each of the second bit lines BL2 may extend in the first direction D1 and disposed on the corresponding conductive via $V_{A3}$ and the corresponding first bit line BL1 in the third direction D3. According to an embodiment of the present invention, each of the second bit lines BL2 may be a portion of the bit line structure BS and connected with the conductive via $V_{A3}$ disposed in the same bit line structure BS. Therefore, each of the bit line structures BS may include the first bit line BL1, the second bit line BL2, and the conductive via $V_{A3}$ disposed between the first bit line BL1 and the second bit line BL2. In the same bit line structure BS, the second bit line BL2 may be disposed on the conductive via $V_{A3}$ and the first bit line BL1 in the third direction D3, and the first bit line BL1 and the second bit line BL2 may extend in the same direction and electrically connected with each other through the conductive via $V_{A3}$.

By disposing the bit line structures BS including the first bit line BL1, the second bit line BL2, and the conductive via $V_{A3}$ and directly connected with the active magnetic storage elements $M_A$ arraign the two sub-arrays MAS, the reliability of the bit line structures BS may be improved, and the influence of defects in some of the conductive via $V_{A3}$ and/or disconnections of the first bit line BL1 or the second bit line BL2 may be reduced accordingly. According to an embodiment of the present invention, in the strap region SR, a plurality of staggered pads $P_{DS41}$, pads $P_{DW4}$, and pads $P_{DS42}$ are provided corresponding to the conductive vias $V_{DS31}$, the conductive vias $V_{DW3}$, and the conductive vias $V_{DS32}$, respectively. According to an embodiment of the present invention, the second bit line BL2, the pad $P_{DS41}$, the pad $P_{DW4}$, and the pad $P_{DS42}$ are different portions of the fourth metal layer, and the second bit line BL2, the pad $P_{DS41}$, the pad $P_{DW4}$, and the pad $P_{DS42}$ are separated from one another.

Figure 8:
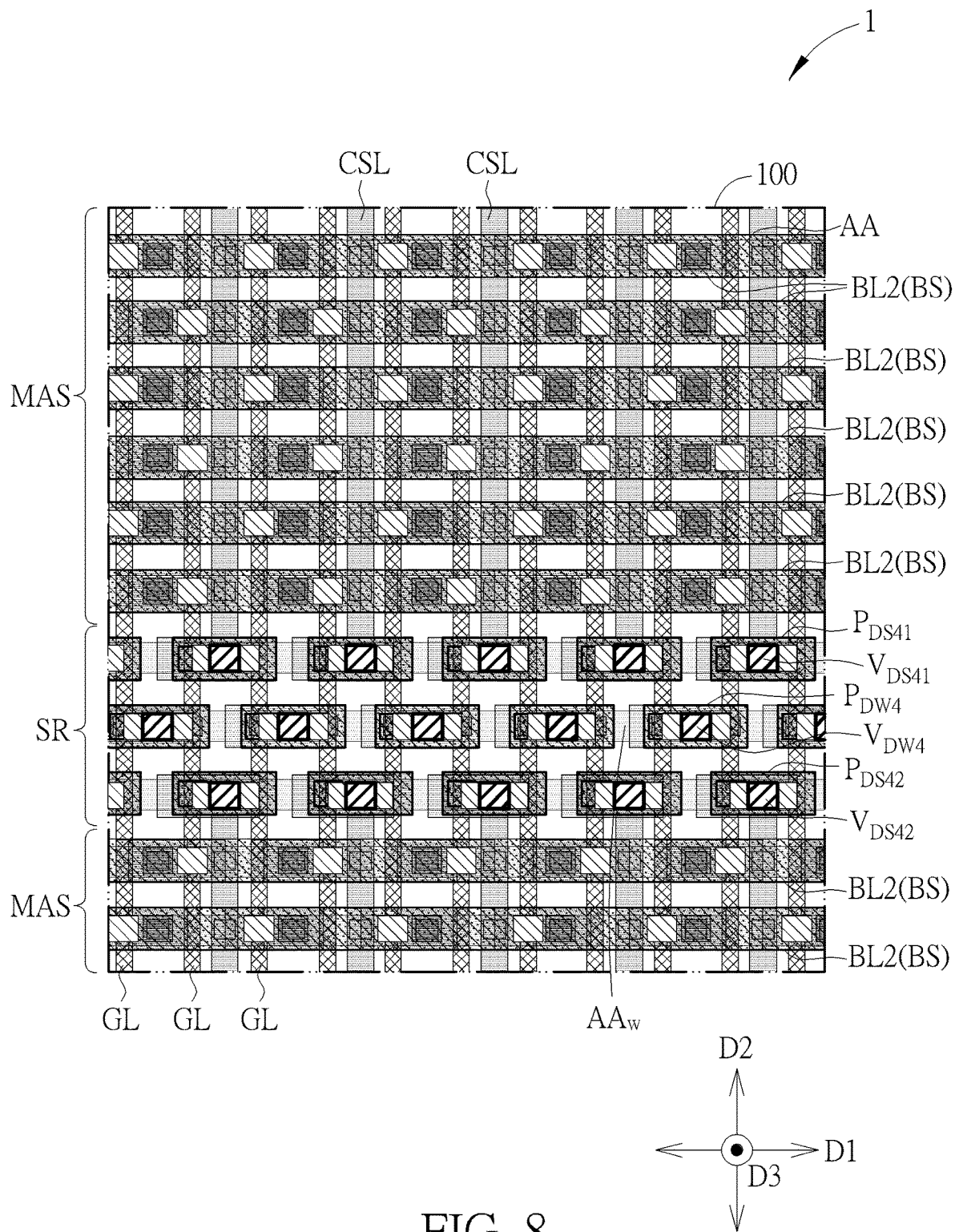
FIG. 8 is a schematic diagram of a memory array according to an embodiment of the present invention, which mainly shows the layout of the conductive vias located on the fourth metal layer.

Please refer to FIG. 8, which is a schematic diagram of a memory array according to an embodiment of the present invention, which mainly shows the layout of conductive vias (such as the conductive vias V4) located on the fourth metal layer. As shown in FIG. 8, the memory array 1 is provided with a plurality of conductive vias $V_{DS41}$, conductive vias $V_{DW4}$, and conductive vias $V_{DS42}$ in a staggered arrangement corresponding to the pads $P_{DS41}$, the pads $P_{DW4}$, and the pads $P_{DS42}$ in the strap region SR., respectively.

Figure 9:
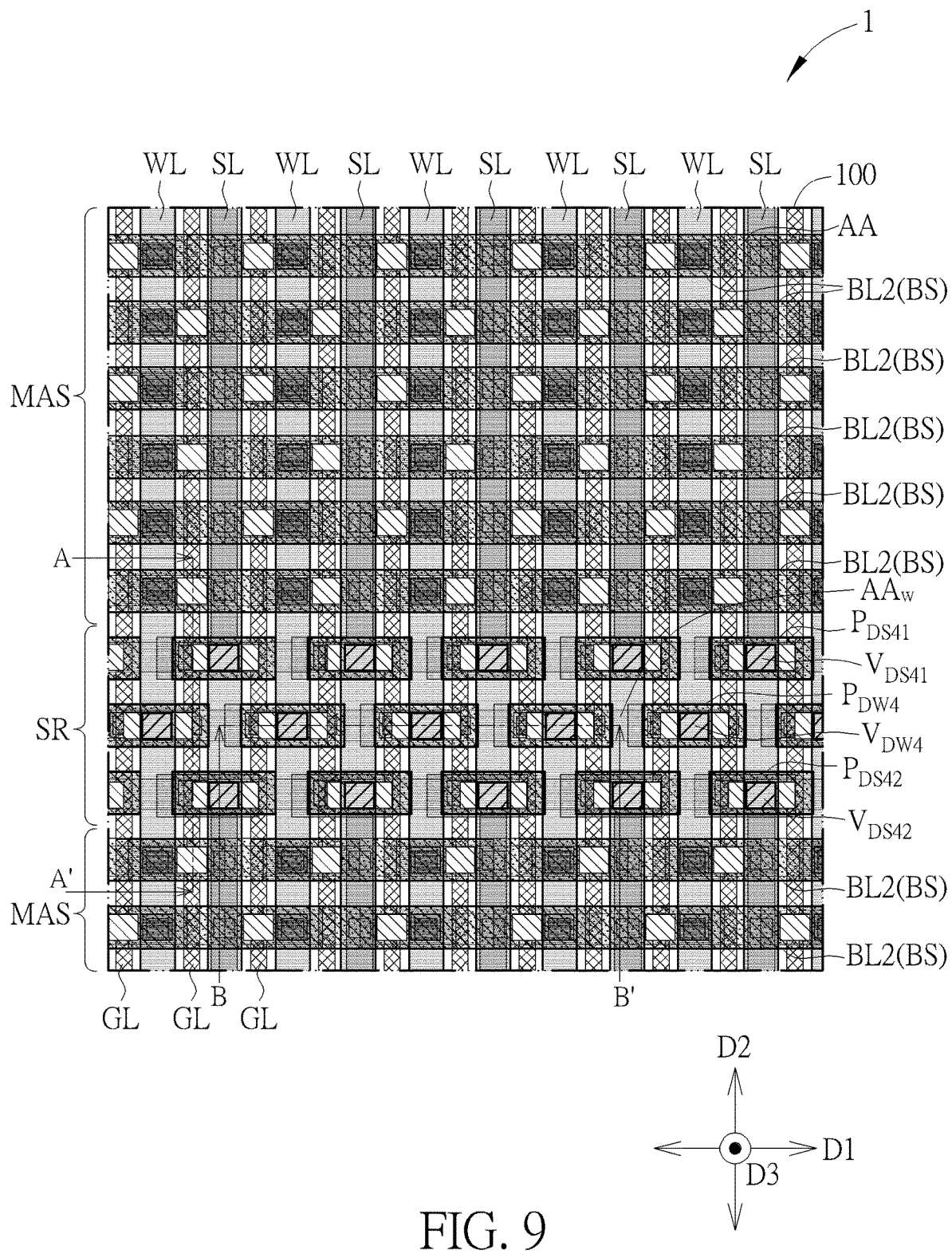
FIG. 9 is a schematic diagram of a memory array according to an embodiment of the present invention, which mainly shows the layout of the fifth metal layer.

Please refer to FIG. 9, which is a schematic diagram of a memory array according to an embodiment of the present invention, which mainly shows the layout of the fifth metal layer (such as the metal layer M5). As shown in FIG. 9, the memory array 1 further includes a plurality of word lines WL and source lines SL located in the fifth metal layer. The word lines WL and the source lines SL are parallel to each other and extend in the second direction D2. The word lines WL are electrically connected to the corresponding conductive vias $V_{DW4}$, and the source lines SL are electrically connected to the corresponding conductive vias $V_{DS41}$ and the conductive vias $V_{DS42}$.

Figure 10:
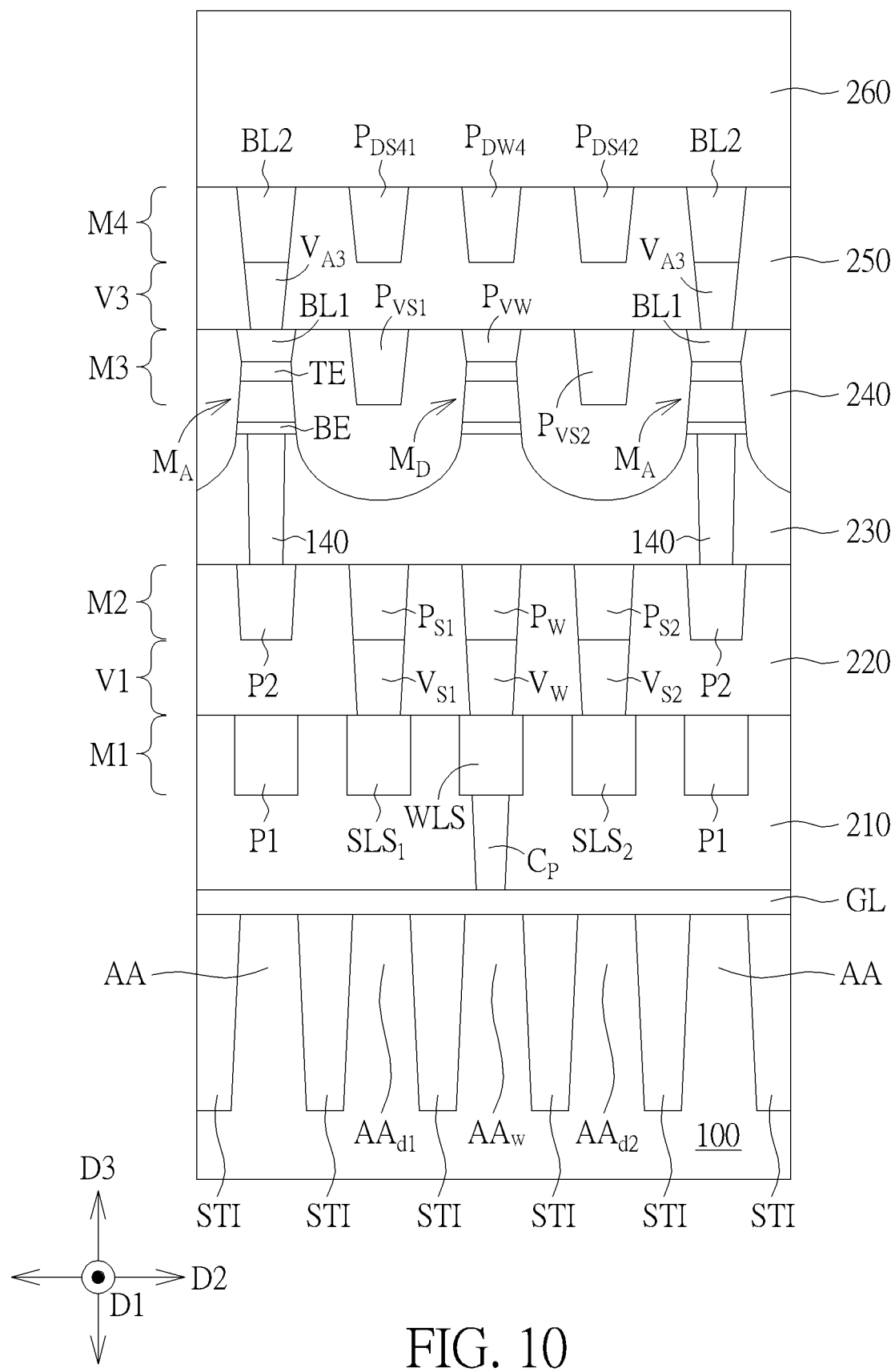
FIG. 10 is a schematic cross-sectional diagram of part of the structure in a sub-array of a memory array according to an embodiment of the present invention.
Figure 11:
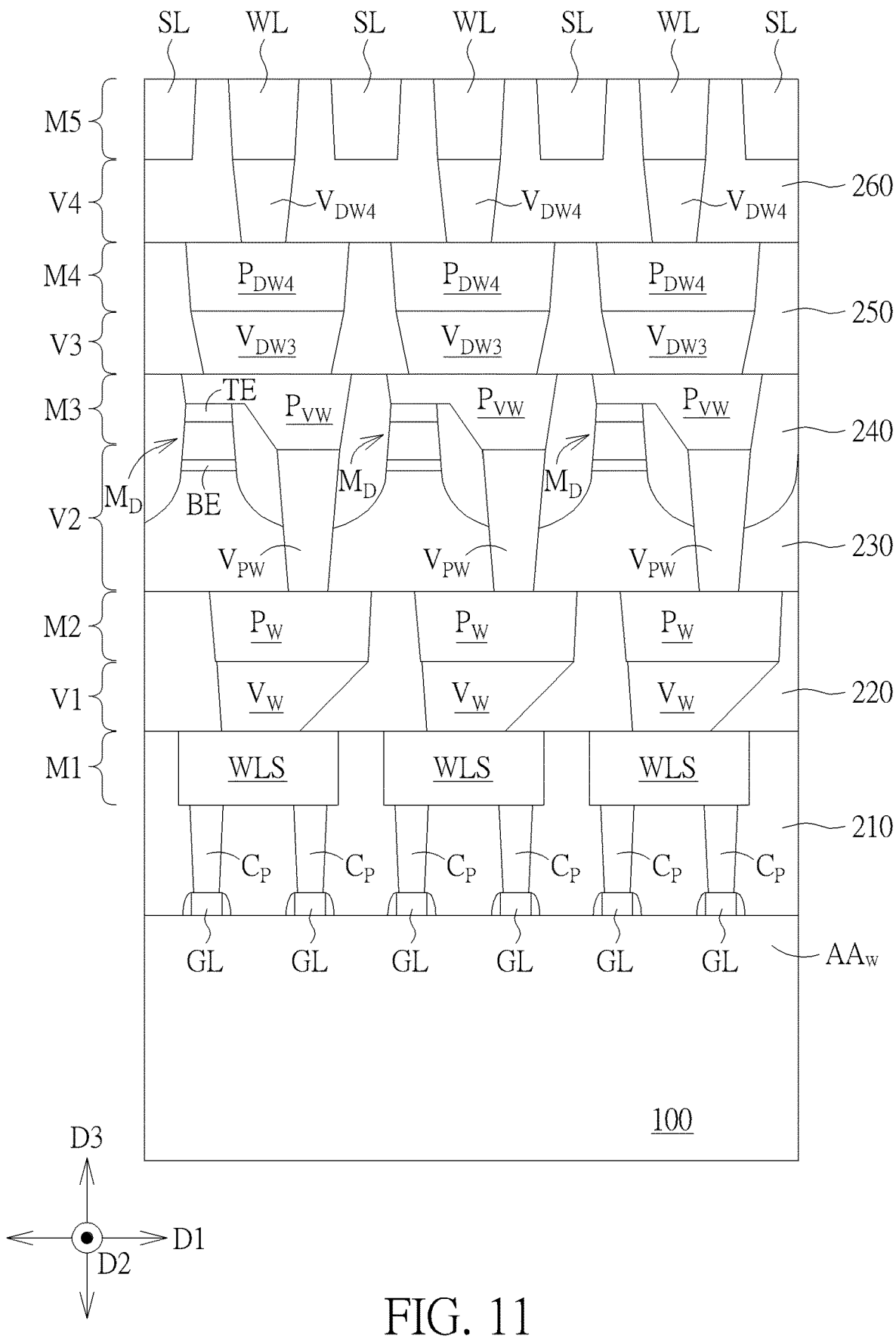
FIG. 11 is another schematic cross-sectional diagram of part of the structure in a sub-array of a memory array according to an embodiment of the present invention.

Please refer to FIG. 10, FIG. 11, and FIG. 9. FIG. 10 is a schematic cross-sectional diagram of part of the structure in a sub-array of a memory array according to an embodiment of the present invention, and FIG. 11 is another schematic cross-sectional diagram of part of the structure in a sub-array of a memory array according to an embodiment of the present invention, wherein like regions, layers or elements are designated by like numeral umbers or labels. In some embodiments, FIG. 10 may be regarded as a schematic cross-sectional view taken along a line A-A' in FIG. 9, and FIG. 11 may be regarded as a schematic cross-sectional view taken along a line B-B' in FIG. 9, but not limited thereto. As shown in FIG. 10, FIG. 11, and FIG. 9, there may be a plurality of dielectric layers on the semiconductor substrate 100, for example, a dielectric layer 210, a dielectric layer 220, a dielectric layer 230, a dielectric layer 240, a dielectric layer 250, and a dielectric layer 260. As described above, there is only the dielectric layer 230 between the bottom electrode BE of the dummy magnetic memory element $M_D$ and the pad below (such as the pad $P_W$), so the bottom electrode BE of the dummy magnetic memory device $M_D$ is not directly connected to the underlying pad $P_W$. According to an embodiment of the present invention, the conductive via $V_{PW}$ may penetrate through the dielectric layer 240 and the dielectric layer 230 for being electrically connected to the underlying pad $P_W$. The pad $P_{PW}$ covers the conductive via $V_{PW}$ and the dummy magnetic storage element $M_D$, and electrically connects the top electrode TE of the dummy magnetic storage element $M_D$ to the conductive via $V_{PW}$. The top electrode TE of the dummy magnetic storage element $M_D$ disposed on the word line strap WLS may be electrically connected to the corresponding word line strap WLS through the pad $P_{VW}$, the conductive via $V_{PW}$, the pad $P_W$, and the conductive via $V_W$. In addition, the top electrode TE of the dummy magnetic storage element $M_D$ disposed on the word line strap WLS may be electrically connected to the corresponding word line WL through the pad $P_{VW}$, the conductive via $V_{DW3}$, the pad $P_{DW4}$, and the conductive via $V_{DW4}$.

Figure 12:
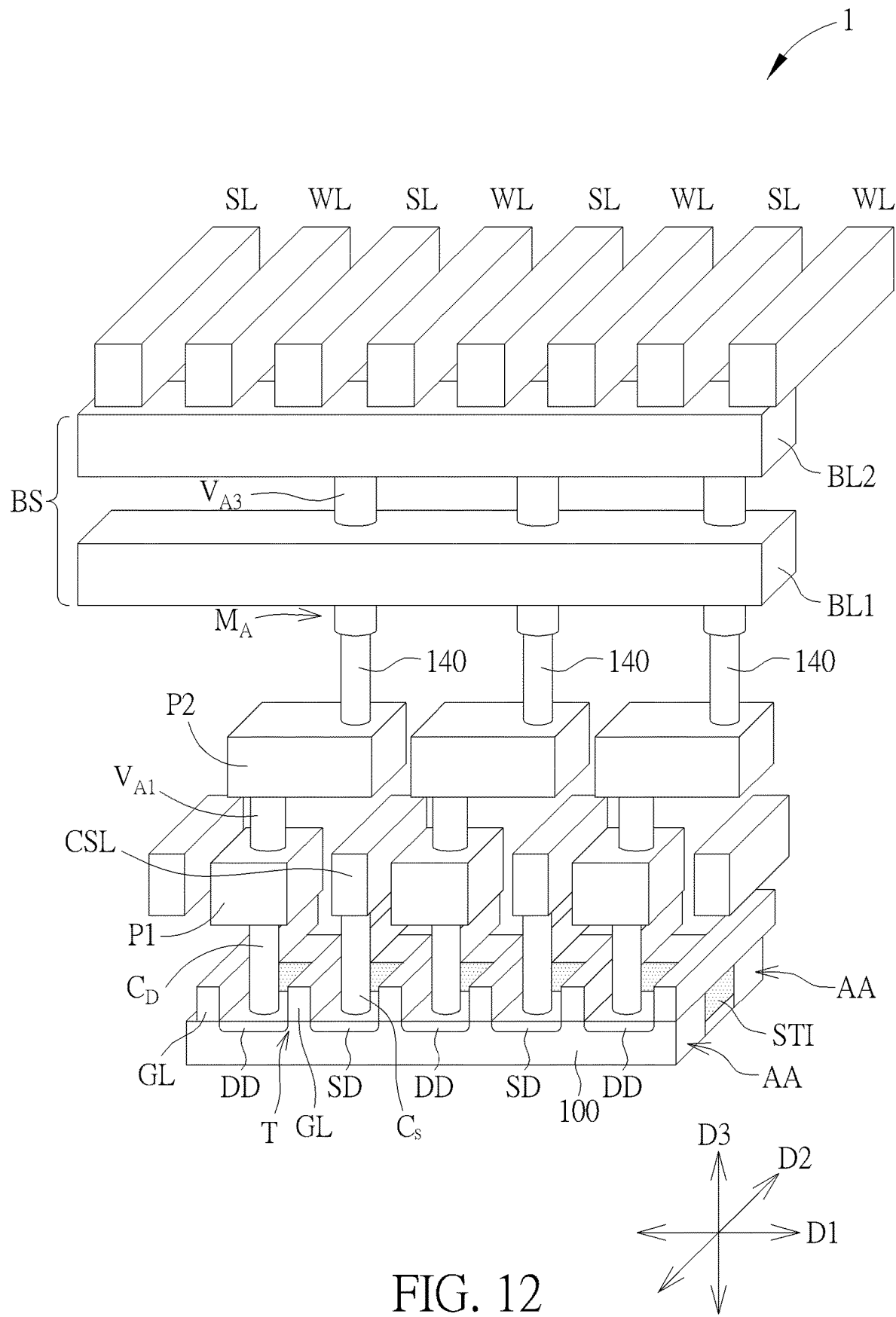
FIG. 12 is a three-dimensional schematic diagram of part of the structure in a sub-array of a memory array according to an embodiment of the present invention.

Please refer to FIG. 12, which is a three-dimensional schematic diagram of part of the structure in the sub-array of the memory array according to an embodiment of the present invention, wherein like regions, layers or elements are designated by like numeral numbers or labels. For the sake of simplicity, the dielectric layers are omitted in this figure. As shown in FIG. 12, the drain region DD of the transistor T is electrically connected to the corresponding pad P1 through the drain contact plug $C_D$, and then electrically connected to the corresponding storage node pad P2 through the conductive via $V_{A1}$. The storage node pad P2 extends toward the spacer above the common source line CS in the first direction D1. The tungsten via 140 is provided on the storage node pad P2. The tungsten via 140 is approximately aligned with the underlying polysilicon gate line GL. The active magnetic storage element $M_A$ is directly disposed above the tungsten via 140, and the first bit line BL1 of the bit line structure BS is disposed directly above the active magnetic storage element $M_A$. The second bit line BL2 in the bit line structure BS is electrically connected to the first bit line BL1 through the conductive via $V_{A3}$, the second bit line BL2 is electrically connected to the corresponding active magnetic storage elements $M_A$ accordingly, and the first bit line BL1 and the second bit line BL2 may extend in the first direction D1. Above the bit line structures BS, word lines WL and source lines SL extend in the second direction D2.

Figure 13:
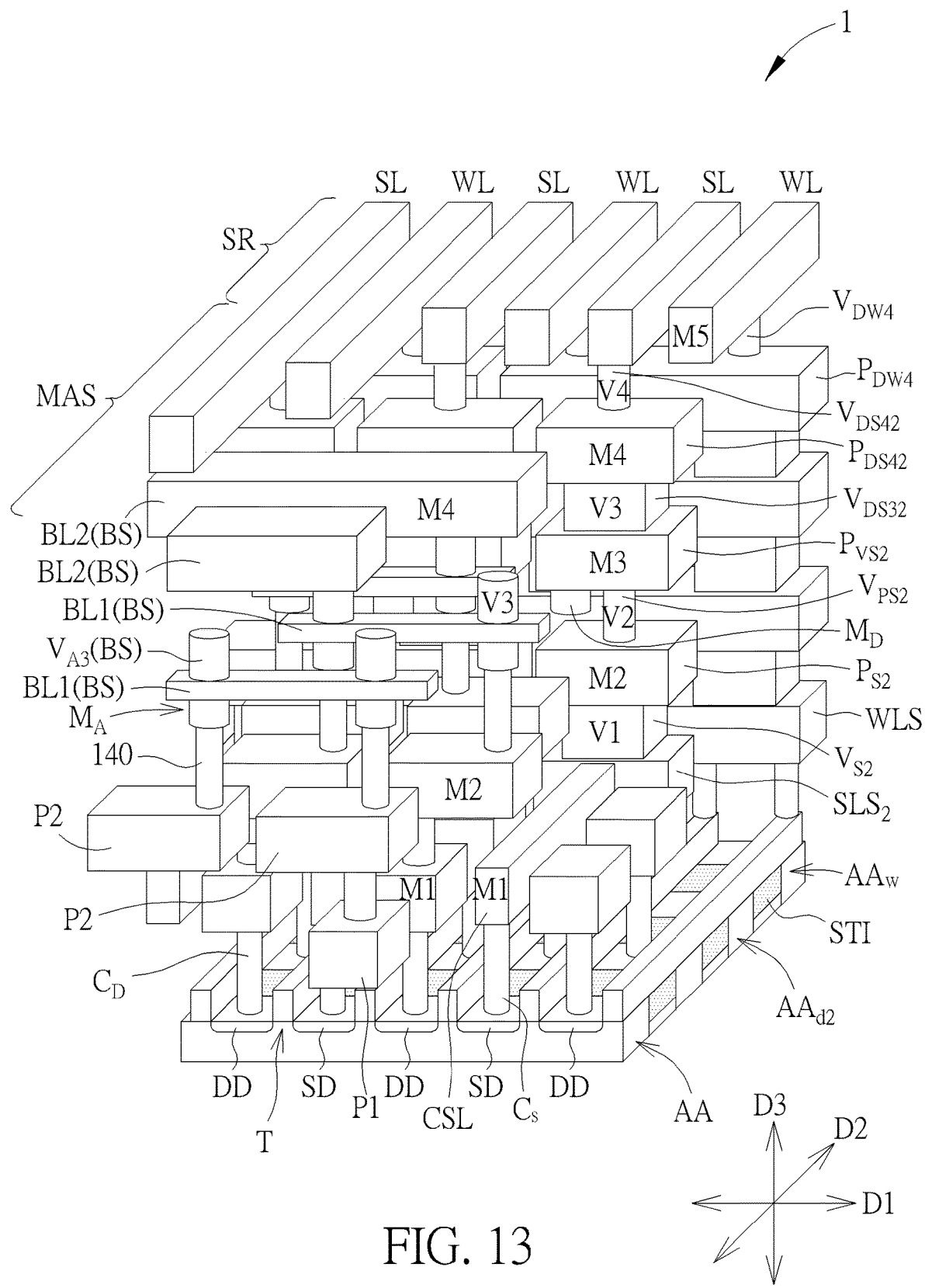
FIG. 13 is a three-dimensional schematic diagram of a part of the structure in a sub-array and a strap region of a memory array according to an embodiment of the present invention.

Please refer to FIG. 13, FIG. 2, and FIG. 3. FIG. 13 is a three-dimensional schematic diagram of a part of the structure in the sub-array MAS and the strap region SR of the memory array according to an embodiment of the present invention, wherein like regions, layers or elements are designated by like numeral numbers or labels. As shown in FIG. 13, FIG. 2, and FIG. 3, the active magnetic storage element $M_A$ and the dummy magnetic storage element $M_D$ are uniformly distributed in the sub-array MAS and the strap region SR in a staggered arrangement, realizing a high-density memory layout. The storage node pad P2 in the sub-array MAS and the pad $P_{S1}$, the pad $P_{S2}$, and the pad $P_W$ in the strap region SR are not aligned on a straight line in the second direction D2, but are arranged in a staggered arrangement. No tungsten vias are arranged on the pad $P_{S1}$, the pad $P_{S2}$, and the pad $P_W$ in the strap region SR. The bottom electrode of the dummy magnetic storage element $M_D$ is not directly electrically connected to the pad $P_{S1}$ the pad $P_{S2}$, and the pad $P_W$ in the strap region SR. The conductive via $V_{PS2}$ is electrically connected to the underlying pad $P_{S2}$. The pad $P_{VS2}$ covers the conductive via $V_{PS2}$ and the dummy magnetic storage element $M_D$, and electrically connects the top electrode of the dummy magnetic storage element $M_D$ to the conductive via $V_{PS2}$. The top electrode of the dummy magnetic storage element $M_D$ may be electrically connected to the corresponding source line SL through the pad $P_{VS2}$, the conductive via $V_{DS32}$, the pad $P_{DS42}$, and the conductive via $V_{DS42}$. In addition, the common source line CSL located in the M1 metal layer is electrically connected to the source line SL located in the metal layer M5 through the second source line strap $SLS_2$ and the connection paths constructed in the conductive via V1, the metal layer M2, the conductive via V2, the metal layer M3, the conductive via V3, the metal layer M4, and the conductive via V4.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array, comprising:
   at least one strap region comprising a plurality of source line straps and a plurality of word line straps;
   at least two sub-arrays comprising a plurality of staggered, active magnetic storage elements, wherein the at least two sub-arrays are separated by the strap region;
   a plurality of staggered, dummy magnetic storage elements disposed within the strap region; and
   a plurality of bit line structures disposed in the at least two sub-arrays, wherein each of the plurality of bit line structures is disposed above and directly connected with at least one of the plurality of staggered, active magnetic storage elements,
   wherein each of the plurality of bit line structures comprises:
   a first bit line; and
   a second bit line disposed above the first bit line, wherein the first bit line and the second bit line are elongated in the same direction and electrically connected with each other.

2. The memory array according to claim 1, wherein each of the plurality of bit line structures is directly connected with at least two of the plurality of staggered, active magnetic storage elements aligned in the same row.

3. The memory array according to claim 1,
   wherein each of the plurality of bit line structures further comprises:
   at least one conductive via disposed between the first bit line and the second bit line,
   wherein the first bit line is electrically connected with the second bit line through the at least one conductive via.

4. The memory array according to claim 1, wherein a top electrode of at least one of the plurality of staggered, dummy magnetic storage elements is electrically connected with one of the plurality of word line straps through a pad disposed on the at least one of the plurality of staggered, dummy magnetic storage elements.

5. The memory array according to claim 4, wherein the pad is a portion of a metal layer, each of the first bit lines is another portion of the metal layer, and the pad is separated from the first bit lines.

6. The memory array according to claim 1, wherein the plurality of source line straps comprises a plurality of first source line straps extending in a first direction and a plurality of second source line straps extending in the first direction.

7. The memory array according to claim 6, wherein the plurality of word line straps extends in the first direction and is located between the plurality of first source line straps and the plurality of second source line straps in a second direction.

8. The memory array according to claim 7, wherein the first direction is orthogonal to the second direction.

9. The memory array according to claim 7, wherein each of the plurality of first source line straps is connected to a common source line extending in the second direction.

10. The memory array according to claim 7, further comprising:
a first dummy diffusion region extending in the first direction, wherein the first dummy diffusion region is disposed directly under the plurality of first source line straps.

11. The memory array according to claim 10, further comprising:
a second dummy diffusion region extending in the first direction, wherein the second dummy diffusion region is disposed directly under the plurality of second source line straps.

12. The memory array according to claim 11, further comprising:
a third dummy diffusion region extending in the first direction, wherein the third dummy diffusion region is disposed directly under the plurality of word line straps, and the third dummy diffusion region is located between the first dummy diffusion region and the second dummy diffusion region in the second direction.

13. The memory array according to claim 7, further comprising:
a plurality of gate lines extending in the second direction.

14. The memory array according to claim 13, wherein the plurality of staggered, active magnetic storage elements comprises a plurality of first active magnetic storage elements arranged in a first column and a plurality of second active magnetic storage elements arranged in a second column, wherein the plurality of first active magnetic storage elements arranged in the first column and the plurality of second active magnetic storage elements arranged in the second column are aligned with the plurality of gate lines extending in the second direction, respectively.

15. The memory array according to claim 1, wherein each of the plurality of staggered, active magnetic storage elements is electrically connected to a storage node pad through a tungsten via.

16. The memory array according to claim 1, wherein no tungsten via is disposed within the strap region.

17. The memory array according to claim 1, wherein the plurality of staggered, dummy magnetic storage elements comprises dummy magnetic tunneling junction (MTJ) elements.

18. The memory array according to claim 17, wherein bottom electrodes of the dummy MTJ elements are not electrically connected to the plurality of source line straps or the plurality of word line straps.

19. The memory array according to claim 1, wherein the plurality of staggered, active magnetic storage elements and the plurality of staggered, dummy magnetic storage elements are uniformly distributed in the at least two sub-arrays and the strap region.

* * * * *